(12) United States Patent
Itakura et al.

(10) Patent No.: US 11,722,102 B2
(45) Date of Patent: Aug. 8, 2023

(54) PROTECTION CIRCUIT

(71) Applicant: KABUSHIKI KAISHA TOSHIBA, Tokyo (JP)

(72) Inventors: Tetsuro Itakura, Nerima Tokyo (JP); Shuhei Miwa, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 147 days.

(21) Appl. No.: 17/446,599

(22) Filed: Aug. 31, 2021

(65) Prior Publication Data

US 2022/0085769 A1 Mar. 17, 2022

(30) Foreign Application Priority Data

Sep. 16, 2020 (JP) ................................ 2020-155724

(51) Int. Cl.
*H03F 1/52* (2006.01)
*H03F 3/21* (2006.01)

(52) U.S. Cl.
CPC .............. *H03F 1/523* (2013.01); *H03F 3/21* (2013.01); *H03F 2200/267* (2013.01); *H03F 2200/91* (2013.01)

(58) Field of Classification Search
CPC ...... H03F 1/523; H03F 3/21; H03F 2200/267; H03F 2200/91; H03F 3/345; H03F 3/213
USPC ............................................. 330/298, 207 P
See application file for complete search history.

(56) References Cited

U.S. PATENT DOCUMENTS

| 9,225,351 | B2 | 12/2015 | Itakura et al. |
| 9,509,259 | B2 | 11/2016 | Oku |
| 11,199,445 | B1* | 12/2021 | Vu .................. G01S 7/4876 |
| 11,381,319 | B2* | 7/2022 | Jongsma ............ H04B 10/116 |

FOREIGN PATENT DOCUMENTS

| JP | H7-162245 A | 6/1995 |
| JP | 2503926 B2 | 6/1996 |
| JP | 2015-119473 A | 6/2015 |
| JP | 6467924 B2 | 2/2019 |

* cited by examiner

*Primary Examiner* — Hieu P Nguyen
(74) *Attorney, Agent, or Firm* — Finnegan, Henderson, Farabow, Garrett & Dunner, LLP

(57) ABSTRACT

A protection circuit comprises a first transistor, a comparator, a second transistor, and a third transistor. The first transistor has a gate connected to an input terminal and configured to pass a drain current based on a potential at the input terminal. The comparator has a non-inverting terminal to which a source of the first transistor is connected and an inverting terminal to which a reference voltage is applied. The second transistor has a gate to which an output of the comparator is applied, a source connected to a power supply voltage, and a drain connected to the input terminal. The third transistor has a gate to which a predetermined voltage is applied, a drain connected to the gate of the second transistor, and a source connected to the drain of the input transistor.

11 Claims, 6 Drawing Sheets

PROTECTION CIRCUIT

CROSS REFERENCE TO RELATED APPLICATIONS

This application is based upon and claims the benefit of priority from the prior Japanese Patent Application No. 2020-155724, filed on Sep. 16, 2020, the entire contents of which are incorporated herein by reference.

FIELD

Embodiments of the present invention relate to a protection circuit.

BACKGROUND

A current amplification circuit is widely used for various purposes. When a large current is input to an input of the current amplification circuit, an input voltage becomes substantially lower than the lowest voltage of the current amplification circuit and may break the circuit. In order to suppress the breakage, a circuit adaptable to a large current is used.

For example, there is a general configuration of comparing the lowest voltage and the input voltage of the current amplification circuit using a folded cascode circuit or a level-shift comparator, but a problem of the configuration is that the response is delayed by the time constant occurring due to the propagation delay because of return or due to the parasitic capacitance of a resistor and a transistor.

DETAILED DESCRIPTION

Figure 1:
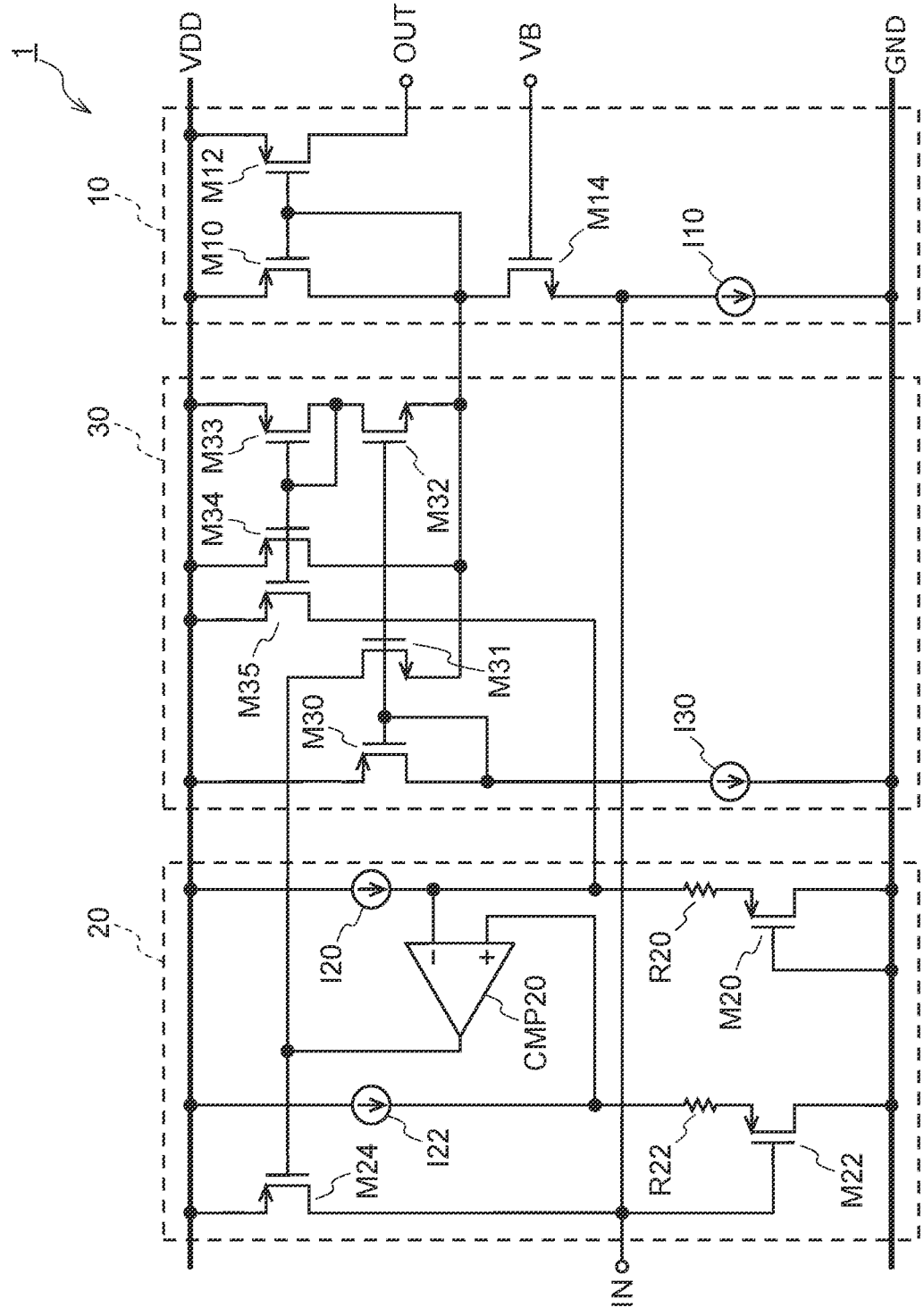
FIG. 1 is a circuit diagram of a semiconductor device according to an embodiment.

According to one embodiment, a protection circuit comprises a first transistor, a comparator, a second transistor, and a third transistor. The first transistor has a gate connected to an input terminal and configured to pass a drain current based on a potential at the input terminal. The comparator has a non-inverting terminal to which a source of the first transistor is connected and an inverting terminal to which a reference voltage is applied. The second transistor has a gate to which an output of the comparator is applied, a source connected to a power supply voltage, and a drain connected to the input terminal. The third transistor has a gate to which a predetermined voltage is applied, a drain connected to the gate of the second transistor, and a source connected to the drain of the input transistor. The protection circuit recovers the lowest potential in a current amplification circuit having an input transistor controlled by a bias voltage.

Hereinafter, embodiments will be explained referring to the drawings. In the explanation, phrases "larger than", "smaller than" and so on are used in some cases, and they may be appropriately replaced by "equal to or larger than", "equal to or smaller than" and so on as needed.

FIG. 1 is a circuit diagram illustrating a semiconductor device according to an embodiment. A semiconductor device 1 is a circuit which amplifies a current output from, for example, a silicon photo multiplier (SiPM). The semiconductor device 1 includes a current amplification circuit 10, a first protection circuit 20, and a second protection circuit 30.

The current amplification circuit 10 is a circuit which includes transistors M10, M12, M14 and amplifies, for example, the current output from the SiPM. The SiPM is a photon counting device composed of a plurality of integrated single photon avalanche diodes (SPADs). A photo multiplier can detect faint light at the photon counting level. On the other hand, the input current is not limited to an input from the SiPM but may be an input from another circuit which needs the amplification of the current.

The transistor M10 is, for example, a p-type MOSFET (Metal-Oxide-Semiconductor Field-Effect Transistor), and has a source connected to a power supply voltage VDD and a drain and a gate connected to each other.

The transistor M12 is, for example, a p-type MOSFET having a source connected to the power supply voltage VDD, a gate connected to the gate of the transistor M10, and a drain connected to an output terminal OUT of the semiconductor device 1. The transistor M12 forms a current mirror with the transistor M10.

The transistor M14 is, for example, an n-type MOSFET having a drain connected to the drain and the gate of the M10, a source connected to a constant current source I10 and an input terminal IN, and a gate connected to a bias voltage input terminal VB. This transistor M14 operates as an input transistor of the current amplification circuit 10.

The constant current source I10 is connected between the source of the transistor M14 and a ground point.

By applying a bias voltage to the bias voltage input terminal VB, a current is passed from the drain to the source of the transistor M14, and a current corresponding to the input current is output from the drain of the transistor M12 by the current mirror constituted by the transistor M10 and the transistor M12. The magnification of the output current to the input current is decided by the transistor M10 and the transistor M12 constituting the current mirror. The transistor M10 may be a transistor having a variable parameter so as to adjust the magnification.

The semiconductor device 1 is formed mainly as a circuit which multiplies the input current by a predetermined number by the current amplification circuit 10 and outputs the resulting current. When a large current is input, a voltage lower than the lowest voltage of the circuit is continuously applied to the current amplification circuit 10 in some cases, so that the transistor and so on are possibly broken.

For example, as the current output from the SiPM used for light detection and ranging (LiDAR), a large current is input to the semiconductor device 1 in some cases when reflection at an object with a high reflectivity or reflected light from an object at a short distance is received. Circuits which quickly recover the applied voltage to a voltage equal to or more than the lowest voltage of the current amplification circuit 10 in such a case to thereby protect the current amplification circuit 10 are the first protection circuit 20 and the second protection circuit 30.

The first protection circuit 20 is illustrated as an example, and the first protection circuit 20 is replaceable with another general protection circuit. The first protection circuit 20 includes, as an example, transistors M20, M22, M24, constant current sources 120, 122, a comparator CMP20, and resistors R20, R22.

The transistor M20 is, for example, a p-type MOSFET having a source connected to the power supply voltage VDD via the constant current source 120 and the resistor R20 and a gate and a drain which are grounded. The transistor M20 operates as an input transistor of the first protection circuit 20, and generates a voltage based on the ground voltage on the source side together with the constant current source 120 and the resistor R20. Note that the VDD and the GND are used as the power supply voltages in this embodiment, but the ground voltage may be a predetermined voltage VSS lower than the VDD depending on the configuration of the circuit.

The transistor M22 is, for example, a p-type MOSFET having a source connected to the power supply voltage VDD via a constant current source 122 and a resistor R22, a drain grounded, and a gate connected to the input terminal IN. The transistor M22 generates a voltage on the source side based on the potential at the input terminal IN together with the constant current source 122 and the resistor R22.

The comparator CMP20 has input terminals connected to the source of the transistor M20 and the source of the transistor M22. For example, the source of the transistor M20 is connected to an inverting input terminal and the source of the transistor M22 is connected to a non-inverting input terminal but, not limited to this, the connection only needs to be able to appropriately apply the voltage to the gate of the transistor M24. The comparator CMP20 compares a voltage (reference voltage) according to the ground voltage at the transistor M20 with a voltage according to the input current to the current amplification circuit 10 at the transistor M22, and produces an output. The comparator CMP20 may be an amplifier which amplifies the difference between them and produces an output.

The transistor M24 is, for example, a p-type MOSFET having a source connected to the power supply voltage VDD, a drain connected to the input terminal IN, and a gate connected to the output of the comparator CMP20. The transistor M24 passes a current to the input terminal IN based on the output from the comparator CMP20.

The operation of the semiconductor device 1 in a state without the second protection circuit 30 will be explained. It is assumed that parameters of circuit elements of the current amplification circuit 10 and the first protection circuit 20 are appropriately set to perform the operations in the following explanation.

Irrespective of whether a current is input to the input terminal IN, a predetermined reference voltage is applied to the source of the transistor M20 having the grounded gate by the constant current source 120 and the resistor R20.

In the case where no current is input to the input terminal IN, a voltage exceeding the threshold voltage is not applied to the gate of the transistor M22, so that a predetermined drain current flows. Therefore, a predetermined constant voltage is applied to the source of the transistor M22 by the constant current source 122 and the resistor R22.

The comparator CMP20 outputs a voltage based on the difference between the voltage of the source of the transistor M20 and the voltage of the source of the transistor M22. The voltage is the one obtained by adjusting the reference voltage, the constant voltage, the magnification of the comparator CMP20 and so on so that the output voltage based on the difference between the constant voltage on the source side of the transistor M22 and the reference voltage on the source side of the transistor M20 becomes a voltage which does not drive the transistor M24.

As a result of the above, the transistor M24 is brought into a state of not passing the drain current in a steady state. Therefore, in a state where no current is input, the semiconductor device 1 is brought into the same state as the state without the first protection circuit 20.

Note that the above is an ideal circuit operation but is not a description meaning that a minute leakage current or a current as a reference of floating is strictly inhibited from flowing. This also applies to the following.

Next, a case where the above state is shifted to a state where a large current is input to the input terminal IN will be explained.

When a large current is input to the input terminal IN, the potential at a region connected to the input terminal IN becomes the lowest voltage, for example, a potential lower than the ground voltage due to a load. In this case, the drain current of the transistor M22 increases, the potential at the non-inverting terminal of the comparator CMP20 drops, and the output voltage of the comparator CMP20 drops.

Due to the drop of the voltage, the transistor M24 is driven to pass a current to the input terminal IN, thereby operating to recover the potential at the input terminal IN, namely, at the source of the transistor M14 of the semiconductor device 1 to the lowest voltage.

Therefore, the recovery to the lowest voltage from the drop of the voltage in the case where the large current is input from the input terminal IN is quickened, thereby avoiding the breakage of the transistors in the current amplification circuit 10.

As explained above, the use of the first protection circuit 20 makes it possible to control the potential at the input terminal IN so that the current amplification circuit 10 normally operates even when a large current is input. Similarly, even at the timing when the current is off after the large current flows, it is possible to conduct a control of allowing an appropriate drain current to flow through the transistor M14.

The first protection circuit 20 delays in control timing in some cases depending on the driving performance of the transistors M22, M24 and the transistor in the comparator CMP20. Hence, the second protection circuit 30 is arranged as illustrated in FIG. 1.

The second protection circuit 30 includes transistors M30, M31, M32, M33, M34, M35 and a constant current source 130. Owing to the inclusion of the second protection circuit 30, the semiconductor device 1 realizes the response to the increase/decrease in current value in the above first protection circuit 20 in a shorter time than that in the case of only including the first protection circuit 20. The inclusion of the second protection circuit 30 makes a response in a short time, thereby decreasing the transient current and shortening the settling time of the semiconductor device 1.

The transistor M30 is, for example, a p-type MOSFET having a source connected to the power supply voltage VDD and a gate and a drain connected to each other, namely, diode-connected, the drain being grounded via a constant current source 130. Therefore, the transistor M30 is brought into a state where a predetermined voltage is applied to the gate.

The transistor M31 is, for example, an n-type MOSFET having a drain connected to the gate of the M24, a gate connected to the gate of the transistor M30, and a source connected to the drain of the transistor M14. The transistor M31 outputs a drain current based on the gate voltage of the transistor M30. As a result of this, the transistor M31 controls the driving of the transistor M24 and the drain voltage of the transistor M14 together with the comparator CMP20 by the predetermined voltage applied to the gate. As the transistor M31, for example, a transistor is used which has a characteristic of passing no drain current when no current is input to the input terminal IN.

The transistor M32 is, for example, an n-type MOSFET having a drain connected to a drain and a gate of the M33, a source connected to the source of the transistor M31, and a gate connected to the gates of the transistors M30, M31. The drain current of the transistor M32 controls the drain current of the transistor M31 and, as a result, controls the driving of the transistor M24 and the drain voltage of the transistor M14. The transistor M32 may be a transistor having the same characteristic as that of the transistor M31.

The transistor M33 is, for example, a p-type MOSFET having a source connected to the power supply voltage VD and a drain and a gate connected to each other, the drain being connected to the drain of the transistor M32.

The transistor M34 is, for example, a p-type MOSFET having a source connected to the power supply voltage VDD, a drain connected to the sources of the transistors M31, M32, and a gate connected to the gate of the transistor M33. Because the gate is connected to the gate and the drain of the transistor M33, the transistor M34 forms a current mirror with the transistor M33, and outputs a drain current proportional to the drain current of the transistor M33. Therefore, the transistor M34 controls the drain voltage of the transistor M14 based on the drain current of the transistor M33.

The transistor M35 is, for example, a p-type MOSFET having a source connected to the power supply voltage VDD, a drain connected to the input of the comparator CMP20, and a gate connected to the gates of the transistors M33, M34. The transistor M35 also forms, as with the transistor M34, a current mirror with the transistor M33, and outputs a drain current proportional to the drain current of the transistor M33. Therefore, the drain current of the transistor M20 is controlled by the drain current of the transistor M35 and controls the voltage of the input of the comparator CMP20.

Figure 2:
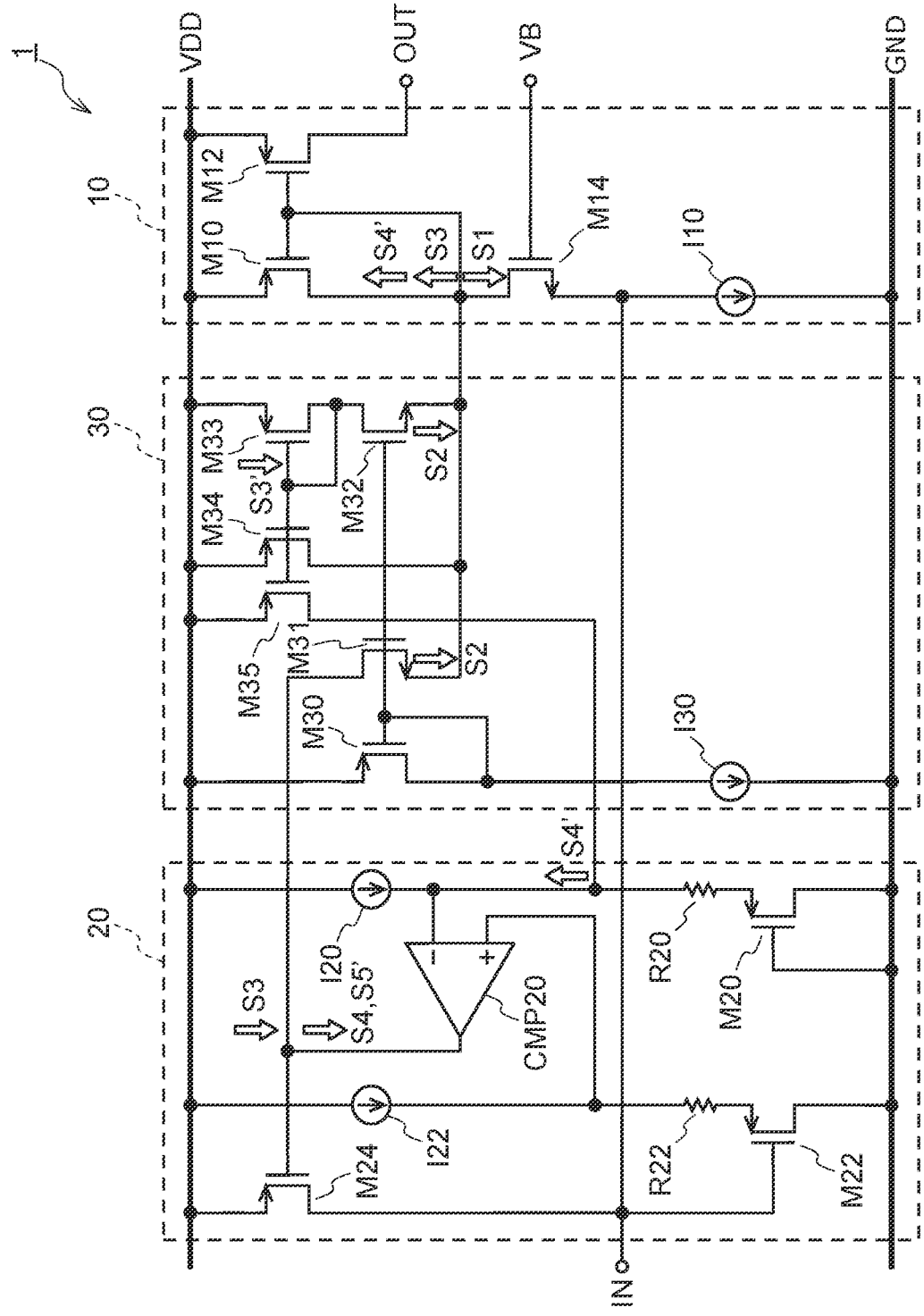
FIG. 2 is a chart illustrating a change in voltage of the semiconductor device according to the embodiment.

The operation of the second protection circuit 30 will be explained. FIG. 2 is a diagram representing an operation status of the transistors in operation explained below. The voltages at nodes change as indicated by arrows in the drawing and explained below.

In a state where no current is input to the input terminal IN, the transistor M31 does not output the drain current. The transistor M32 having the gate connected to the gate of the transistor M31 does not output the drain current either, so that the potential on the drain side becomes higher than the threshold voltages of the transistors M33, M34, M35, and the transistors M33, M34, M35 are brought into an off-state. Therefore, in this state, the semiconductor device 1 performs the operation equivalent to that in the state where the second protection circuit 30 is not connected.

When a large current is input to the input terminal IN from this state, first, the potential at the drain of the transistor M14 drops (S1). Subsequently, the comparator CMP20 produces an output, and then the potential at the gate of the transistor M24 drops via the comparator CMP20 as with the above operation.

At the timing of the drop of the potential at the drain of the transistor M14 previous to the output of the comparator CMP20, the potential at the source of the transistor M31 drops (S2). As a result of this, the potential difference between the drain and the source of the transistor M31 increases, outputs the drain current to increase the drain potential of the transistor M14 and decrease the potential at the gate of the transistor M24 (an output end of the comparator CMP20) (S3).

Once the comparator CMP20 starts to produce an output, the potential at the drain of the transistor M31 further drops (S4).

Since the response speed of the transistor M31 is higher than the response speed of the comparator CMP20, the provision of the transistor M31 makes it possible to raise the potential at the drain and thus the potential at the source of the transistor M14 at a high speed as compared with the case without the transistor M31. It is also possible to lower the gate potential of the transistor M24 at a higher speed than that in the case without the transistor M31. Therefore, it becomes possible to raise the potential at the gates of the transistor M10, M12 at a high speed as compared with the case without the transistor M31.

Further, by inputting a large current, the potentials at the source and the drain of the transistor M14 greatly drop. As a result of this, the drain current flows through the transistor M32 (S2) and the gate potential of the transistor M33 drops (S3'). By the drop of the voltage to be applied to the gate, the transistor M33 is turned on.

The transistor M34 constituting the current mirror with the transistor M33 outputs the drain current proportional to the drain current of the transistor M33 to the drain side of the transistor M14 to thereby increase the drain potential of the transistor M14 at a higher speed (S4').

The transistor M35 constituting the current mirror with the transistor M33 outputs the drain current proportional to the drain current of the transistor M33 to the inverting terminal side of the comparator CMP20. The drain current and the resistor R20 and the transistor M20 increase the potential on the inverting terminal side of the comparator CMP20 (S4') and further decrease the voltage output from the comparator CMP20 (S5'). This makes it possible to shift the transistor M24 to a saturated state at a higher speed.

Figure 3:
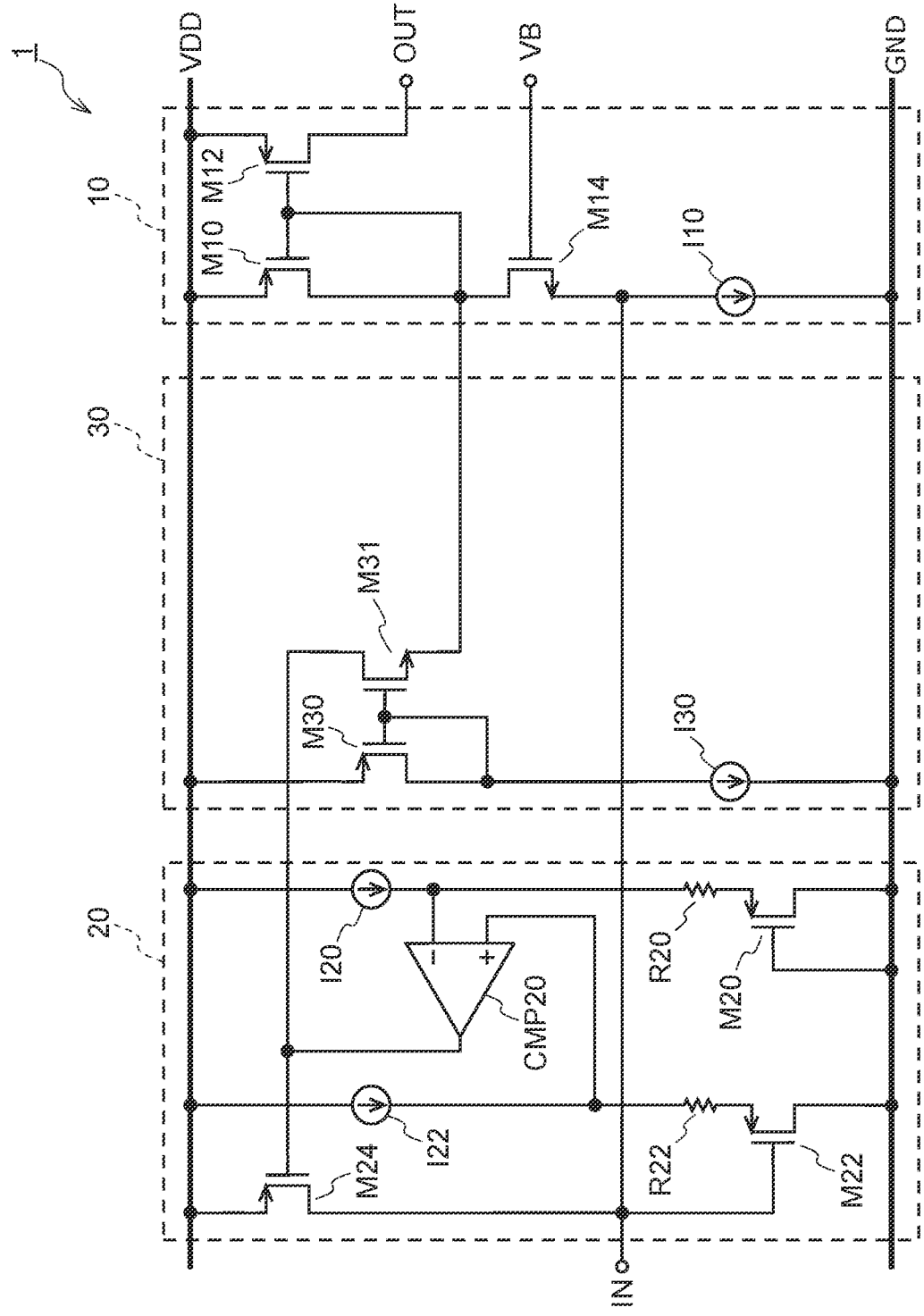
FIG. 3 is a circuit diagram of a semiconductor device according to an embodiment.
Figure 4:
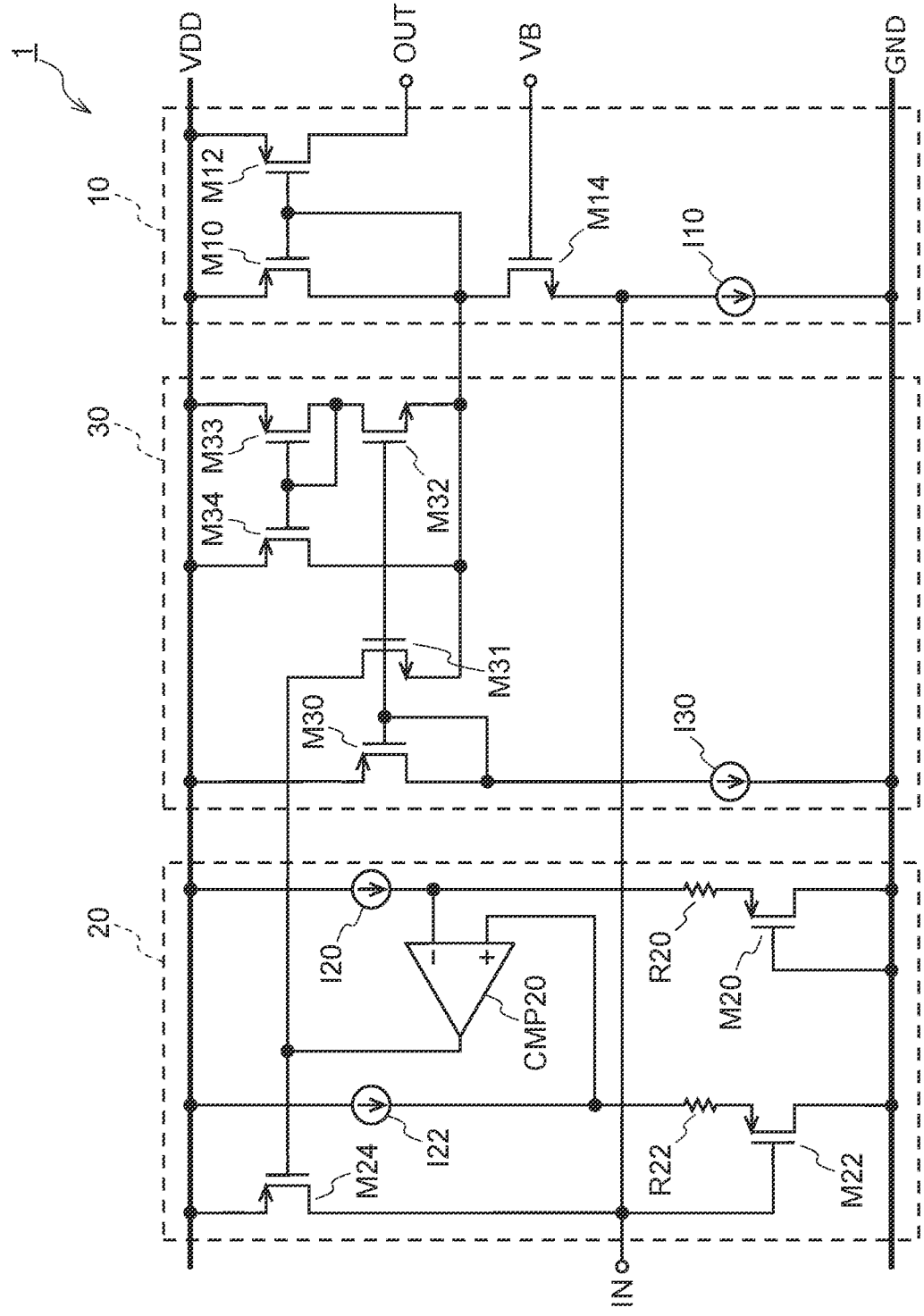
FIG. 4 is a circuit diagram of a semiconductor device according to an embodiment.
Figure 5:
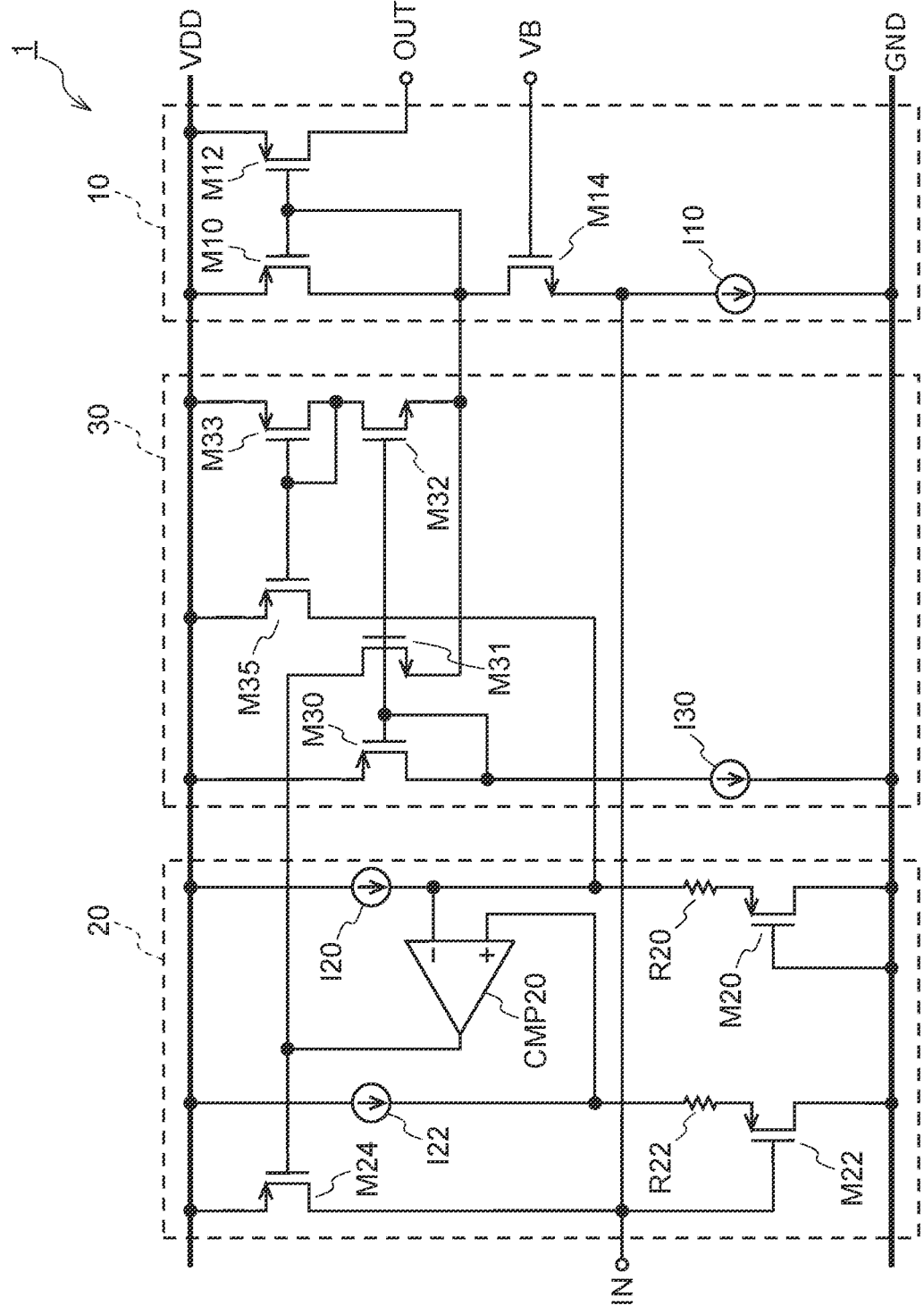
FIG. 5 is a circuit diagram of a semiconductor device according to an embodiment.

Considering the above-described operation, for example, the second protection circuit 30 only needs to have a configuration including at least the transistor M30 and the transistor M31 which control the drain voltage of the transistor M14 as illustrated in FIG. 3. Further, as illustrated in FIG. 4, the second protection circuit 30 may have the configuration of the transistors M32 to M34 which improve the control speed of the drain voltage of the transistor M14. As another example, as illustrated in FIG. 5, the second protection circuit 30 may have a configuration made by combining the transistors M32, M33, M35 so as to increase the speed of controlling the transistor M24 by the comparator CMP20. As a matter of course, the second protection circuit 30 may be configured to have all of the transistors M30 to M35.

As in the above, according to this embodiment, the current amplification circuit 10 includes the transistor M31 in the second protection circuit 30 in addition to the general first protection circuit 20, and thereby can make a recovery to the lowest voltage at a higher speed from the voltage drop due to the input of a large current. Further, the transistors M32, M33, M34 can recover the potentials at the drain and the source of the transistor M14 at the input end of the current amplification circuit 10 at a higher speed. Furthermore, in addition to the above configuration, the transistor M35 can shift the output of the comparator CMP20 to a lower voltage, thus controlling the operation of the transistor M24 to further quicken the recovery to the lowest voltage of the current amplification circuit 10.

From the above, the second protection circuit according to this embodiment can prevent the input voltage from being much lower than the lowest voltage due to the flow of the large current through the current amplification circuit 10 and can shorten the time during which the voltage lower than the lowest voltage is applied, thereby avoiding the breakage of the transistors in the current amplification circuit 10 due to the input of the voltage lower than the lowest voltage.

Figure 6:
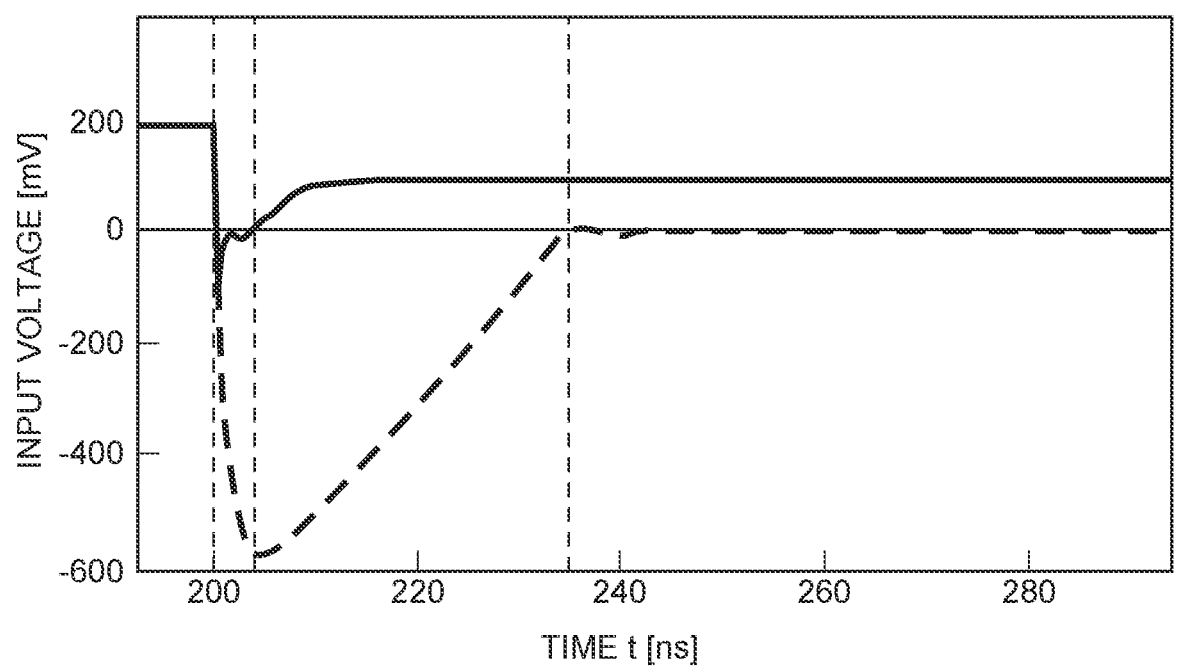
FIG. 6 is a graph illustrating a shift of voltage of the semiconductor device according to the embodiment.

FIG. 6 is a graph illustrating the settling time, namely, the recovery time to the lowest voltage of the current amplification circuit 10 according to this embodiment. A solid line is a graph indicating the shift of the source voltage of the transistor M14 in the case where the first protection circuit 20 and the second protection circuit 30 according to this embodiment are provided, and a broken line is a graph indicating the shift of the source voltage of the transistor M14 in the case where the second protection circuit 30 is not provided.

As illustrated in FIG. 6, it is apparent that the settling time in a comparative example is about 40 nsec, whereas the settling time in the current amplification circuit 10 in this embodiment is speeded up to about 5 nsec.

Note that the embodiment in this disclosure is a form using mainly the MOSFET, but may be another transistor such as a bipolar transistor as long as long as it can appropriately perform the same operation. Besides, the p-type and the n-type are not bound by the above description but their polarities may be changed so as to perform an appropriate operation.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A protection circuit which recovers a lowest potential in a current amplification circuit having an input transistor controlled by a bias voltage, the protection circuit comprising:
   a first transistor having a gate connected to an input terminal and configured to pass a drain current based on a potential at the input terminal;
   a comparator having a non-inverting terminal to which a source of the first transistor is connected and an inverting terminal to which a reference voltage is applied;
   a second transistor having a gate to which an output of the comparator is applied, a source connected to a power supply voltage, and a drain connected to the input terminal; and
   a third transistor having a gate to which a predetermined voltage is applied, a drain connected to the gate of the second transistor, and a source connected to the drain of the input transistor.

2. The protection circuit according to claim 1, further comprising:
   a fourth transistor having a gate to which the predetermined voltage is applied, and a source connected to the drain of the input transistor;
   a fifth transistor having a gate connected to a drain, and a source connected to the power supply voltage, the drain being connected to the drain of the fourth transistor; and
   a sixth transistor having a gate connected to the gate of the fifth transistor, a source connected to the power supply voltage, and a drain connected to the drain of the input transistor.

3. The protection circuit according to claim 2, further comprising
   a seventh transistor having a gate connected to the gate of the fifth transistor, a source connected to the power supply voltage, and a drain connected to the inverting input terminal of the comparator.

4. The protection circuit according to claim 1, further comprising:
   a fourth transistor having a gate to which the predetermined voltage is applied, and a source connected to the drain of the input transistor;
   a fifth transistor having a gate connected to a drain, and a source connected to the power supply voltage, the drain being connected to the drain of the fourth transistor; and
   a seventh transistor having a gate connected to the gate of the fifth transistor, a source connected to the power supply voltage, and a drain connected to the inverting input terminal of the comparator.

5. The protection circuit according to claim 1, further comprising
   an eighth transistor having a gate connected to the gate of the third transistor, and a source connected to the power supply voltage.

6. The protection circuit according to claim 5, further comprising
   a first current source connected to a drain of the eighth transistor.

7. The protection circuit according to claim 2, further comprising
   an eighth transistor having a gate connected to the gate of the third transistor and the gate of the fourth transistor, and a source connected to the power supply voltage.

8. The protection circuit according to claim 7, further comprising
   a first current source connected to a drain of the eighth transistor.

9. The protection circuit according to claim 1, further comprising
   a ninth transistor having a gate grounded, and a source connected to the inverting terminal of the comparator via a resistor.

10. The protection circuit according to claim 9, further comprising
    a second current source connected between the power supply voltage and the inverting terminal of the comparator.

11. A protection circuit which recovers a lowest potential in a current amplification circuit having an input transistor controlled by a bias voltage, the protection circuit comprising:
    a comparator configured to compare a potential at an input terminal and a reference voltage;
    a first element configured to output a current to the input terminal based on an output of the comparator; and
    a second element connected between the output of the comparator and the input transistor and configured to drive the first element earlier than the output of the comparator based on a voltage drop at a connection point with the input transistor.

\* \* \* \* \*